(12) United States Patent
Van Buskirk et al.

(10) Patent No.: US 7,012,292 B1
(45) Date of Patent: Mar. 14, 2006

(54) OXIDATIVE TOP ELECTRODE DEPOSITION PROCESS, AND MICROELECTRONIC DEVICE STRUCTURE

(75) Inventors: Peter C. Van Buskirk, Newtown, CT (US); Steven M. Bilodeau, Oxford, CT (US); Stephen T. Johnston, Bethel, CT (US); Daniel J. Vestyck, Danbury, CT (US); Michael W. Russell, Norwalk, CT (US)

(73) Assignee: Advanced Technology Materials, Inc, Danbury, CT (US)

(*) Notice: Subject to any disclaimer, the term of this patent is extended or adjusted under 35 U.S.C. 154(b) by 0 days.

(21) Appl. No.: 09/200,495

(22) Filed: Nov. 25, 1998

(51) Int. Cl.
*H01L 29/76* (2006.01)
*H01L 29/94* (2006.01)
*H01L 31/062* (2006.01)
*H01L 31/113* (2006.01)
*H01L 31/119* (2006.01)

(52) U.S. Cl. .................. 257/295; 257/310; 257/410
(58) Field of Classification Search ............. 257/295, 257/310, 410; 438/3, 240; 361/313
See application file for complete search history.

(56) References Cited

U.S. PATENT DOCUMENTS

| 5,043,049 A | 8/1991 | Takenaka ............... 204/192.15 |
| 5,189,503 A | 2/1993 | Suguro et al. ............. 257/310 |
| 5,216,572 A * | 6/1993 | Larson et al. ............. 361/313 |
| 5,561,307 A | 10/1996 | Mihara et al. ............ 257/295 |
| 5,719,417 A | 2/1998 | Roeder et al. ............ 257/295 |
| 5,736,422 A | 4/1998 | Lee et al. ................. 437/201 |
| 5,751,540 A | 5/1998 | Lee et al. ................. 361/321.4 |
| 5,783,716 A | 7/1998 | Baum et al. ............... 556/136 |
| 5,807,774 A * | 9/1998 | Desu et al. ................. 438/240 |
| 5,852,307 A * | 12/1998 | Aoyama et al. ............ 257/295 |
| 5,859,274 A | 1/1999 | Baum et al. ................. 556/76 |
| 5,892,254 A * | 4/1999 | Park et al. ................ 257/295 |
| 5,973,911 A * | 10/1999 | Nishioka ................. 361/313 |
| 6,002,150 A | 12/1999 | Gardner et al. ........... 257/310 |
| 6,005,274 A | 12/1999 | Gardner et al. ........... 257/411 |

(Continued)

FOREIGN PATENT DOCUMENTS

WO         WO98/01904         *    1/1998

OTHER PUBLICATIONS

Rossnagel, S.M. et al, "Thin high atomic weight refractor film deposition for diffusion barrier, adhesion layer, and seed Layer applications", *J. Vac. Sci. Technol. B*, vol. 14, No. 3, May/Jun. 1996 pp. 1820-1828.

(Continued)

*Primary Examiner*—Shouxiang Hu
(74) *Attorney, Agent, or Firm*—Steven J. Hultquist; Intellectual Property/ Technology Law; Margaret Chappuis

(57) ABSTRACT

A method of preventing oxygen deficiency in a ferroelectric or high $\epsilon$ film material having a top electrode layer deposited thereon. Process conditions are employed that either enable the top electrode layer to be formed without oxygen abstraction from the ferroelectric or high $\epsilon$ film material in the vicinity and at the top surface thereof, or else provide the ferroelectric or high $\epsilon$ film material in the vicinity and at the top surface thereof with a surplus of oxygen. In the latter case, the deposition formation of the top electrode layer on the ferroelectric or high $\epsilon$ film material depletes the overstoichiometric excess of the oxygen in the film material, to yield a device structure including an electrode on a film material having a proper stoichiometry, e.g., of $PbZrTiO_3$.

12 Claims, 2 Drawing Sheets

U.S. PATENT DOCUMENTS

| | | | |
|---|---|---|---|
| 6,020,643 A * | 2/2000 | Fukuzumi et al. | 257/774 |
| 6,191,443 B1 * | 2/2001 | Al-Shareef et al. | 257/310 |
| 6,229,168 B1 * | 5/2001 | Nakamura | 257/295 |
| 6,300,212 B1 * | 10/2001 | Inoue et al. | 438/396 |
| 6,309,894 B1 * | 10/2001 | Miki et al. | 438/3 |

OTHER PUBLICATIONS

J.L. Vossen, W. Kern, Eds., *Thin Film Processes II*, Academic Press, Boston, MA, 1991, pp. 763.

* cited by examiner

OXIDATIVE TOP ELECTRODE DEPOSITION PROCESS, AND MICROELECTRONIC DEVICE STRUCTURE

BACKGROUND OF THE INVENTION

1. Field of the Invention

The present invention relates to an oxidative top electrode deposition process, and associated microelectronic device structure.

2. Description of the Related Art

Ferroelectric and high $\epsilon$ thin film capacitors are becoming increasingly important in microelectronics applications, as for example in capacitor structures for advanced memories, in decoupling capacitors and in infrared detectors. In such applications, the ferroelectric or high $\epsilon$ film is typically formed of an oxide perovskite or layered structure perovskite, such as lead zirconium titanate ($PbZrTiO_3$), barium and/or strontium titanates (($Ba,Sr)TiO_3$), and strontium bismuth tantalates ($SrBi_2Ta_2O_9$), although other similar materials may also be usefully employed.

Properties of ferroelectric and high $\epsilon$ thin film capacitors depend, in general, on the stoichiometry (atomic relative concentrations of constituent elements) of the film material. While the most common concerns involving the film material relate to cation stoichiometry, the stoichiometric presence of oxygen is likewise important, since the electrical properties of the film are extremely sensitive to oxygen concentration as well.

Formation of capacitor structures utilizing ferroelectric or high $\epsilon$ film oxide materials typically involves vacuum deposition of a metal electrode on top of the oxide layer. The conditions conventionally utilized for deposition formation of such top electrode (TE) structures cause oxygen loss in the underlying ferroelectric or high $\epsilon$ film, particularly at its surface.

Such oxygen loss may be due to chemical and/or physical aspects of the TE deposition process.

Chemical aspects include a higher affinity for oxygen by the TE material as compared to the ferroelectric material, or by other chemical driving forces for deoxygenation, such as the environment in a metal chemical vapor deposition (CVD) process that may be used to deposit the TE.

Physical effects include thermal desorption that may be stimulated by the transfer of energy of an incident atom, such as by sputtering, in instances where sputtering is used as the metallization technique to form the electrode element. Under such conditions, an adatom with superthermal energy (>1 eV) can directly cause ejection of an oxygen atom from the underlying ferroelectric or high e film material.

For dc magnetron sputtering of Ir (for example), adatom energies at the film surface can be on the order of 120 eV for Ar (S. M Rossnagel, C. Nichols, S. Hamaguchi, D. Ruzic, R. Turkot, J. Vac. Sci. and Tech., 14(3) (1996) 1819–1827), and 25 eV for Ir. Since 200 eV Ar is known to modify the surface of crystalline Si to a depth of 28 Å (J. L. Vossen, W. Kern, Eds., *Thin Film Processes II*, Academic Press, Boston, Mass., 1991, pp. 763), Ar bombardment in a magnetron deposition process may have potentially significant deoxygenation effects on the surface of a ferroelectric such as lead zirconium titanate ($PbZrTiO_3$).

While oxygen loss from the underlying ferroelectric or high $\epsilon$ film material may in principle be compensated by post-annealing the film under oxidizing conditions, such approach depends on the ability of the TE to allow oxygen to diffuse from the annealing atmosphere to the ferroelectric or high $\epsilon$ film surface. An electrode formed of platinum will allow diffusion therethrough of oxygen for that purpose, but other, more desirable TE materials such as Ir and $IrO_2$ will not—they are good oxygen diffusion barriers. Accordingly, for the more desirable TE materials of construction, oxidative post-deposition annealing is not a feasible option.

Accordingly, it would be a significant advance in the art, and is accordingly an object of the present invention, to provide a methodology for forming a top electrode structure, on a ferroelectric or high $\epsilon$ material that is latently susceptible to deoxygenation during the electrode formation step, which effectively prevents the ferroelectric or high $\epsilon$ film from becoming oxygen-deficient during top electrode deposition.

It is another object of the invention to provide a microelectronic device structure including a ferroelectric or high $\epsilon$ film material overlaid with a top electrode structure, wherein the ferroelectric or high e film material is stoichiometrically non-deficient—i.e., is stoichiometrically satisfied—in oxygen content, even at the surface region of the ferroelectric or high $\epsilon$ film material adjacent to the TE layer.

Other objects and advantages of the invention will be more fully apparent from the ensuing disclosure and appended claims.

SUMMARY OF THE INVENTION

The present invention generally relates to a method of forming a top electrode on a film of ferroelectric or high $\epsilon$ film material, and to a microelectronic device structure formed by the method of the invention.

In one method aspect, the invention relates to fabricating a microelectronic device structure including forming a ferroelectric or high $\epsilon$ film material by a growth process and depositing an electrode layer on a surface of the ferroelectric or high $\epsilon$ film material by a deposition process, wherein the growth process and the deposition process are carried out such that in the microelectronic device the ferroelectric or high $\epsilon$ film material at said surface and in the vicinity thereof is substantially stoichiometrically complete in oxygen concentration.

In yet another method aspect, the invention relates to a method of fabricating a microelectronic device structure including depositing a top electrode layer on a ferroelectric or high $\epsilon$ film material by a deposition process including at least one of the following deposition process characteristics:

(1) the top electrode being formed of a metallic non-oxide material by sputtering in the presence of oxygen;

(2) the electrode is formed of a noble metal that is formed by evaporation of a noble metal source material in the presence of oxygen;

(3) the electrode layer is formed by sputtering under conditions minimizing bombarding energy and flux during deposition, whereby oxygen loss from the surface of the ferroelectric or high $\epsilon$ film material is minimized, and to physical damage to the lattice of the ferroelectric or high $\epsilon$ film material is reduced;

(4) the ferroelectric or high E film material surface is processed so that it contains excess oxygen, either in the lattice or in grain boundaries thereof, by ion implantation of oxygen at energies greater than 200 electron volts (eV);

(5) forming the top electrode layer from a noble metal by chemical vapor deposition (CVD), using a CVD process that incorporates oxygen; and (6) deposition of a composite electrode film comprising a noble metal and an oxide compound.

In another method aspect, the invention relates to a method of fabricating a microelectronic device structure including depositing a top electrode layer on a lead zirconium titanate (PZT) film material by a process including at least one of the following deposition process characteristics:

(1) forming the PZT material by a deposition growth process including growth of the PZT material in an oxygen-containing environment, wherein said growth is carried out during a terminal part of the process under oxygen-excess conditions; and (2) forming the PZT material by a deposition growth process including growth of the PZT material in an oxygen-containing environment, wherein said PZT material growth is carried out during a terminal part of the process under oxygen-deficient conditions producing a correspondingly oxygen-deficient metallic capping layer.

A still further aspect of the invention relates to a microelectronic device structure including a top electrode layer on a ferroelectric or high $\epsilon$ film material (e.g., with the ferroelectric or high $\epsilon$ film material comprising an oxide perovskite, and the top electrode layer comprising a metal deposited on a surface of the ferroelectric or high $\epsilon$ film material), wherein the ferroelectric or high $\epsilon$ film material at such surface and in the vicinity thereof is substantially stoichiometrically complete in oxygen concentration.

As used herein, the term "in the vicinity thereof" in reference to the surface of the ferroelectric or high $\epsilon$ film material, means at a depth measured from such surface that is less than 25 Angstroms.

The term "substantially stoichiometrically complete in oxygen concentration" means that the oxide perovskite film material has an atomic composition of oxygen and constituent metals that are related in whole integer proportions to one another.

DETAILED DESCRIPTION OF THE INVENTION, AND PREFERRED EMBODIMENTS THEREOF

Figure 1:
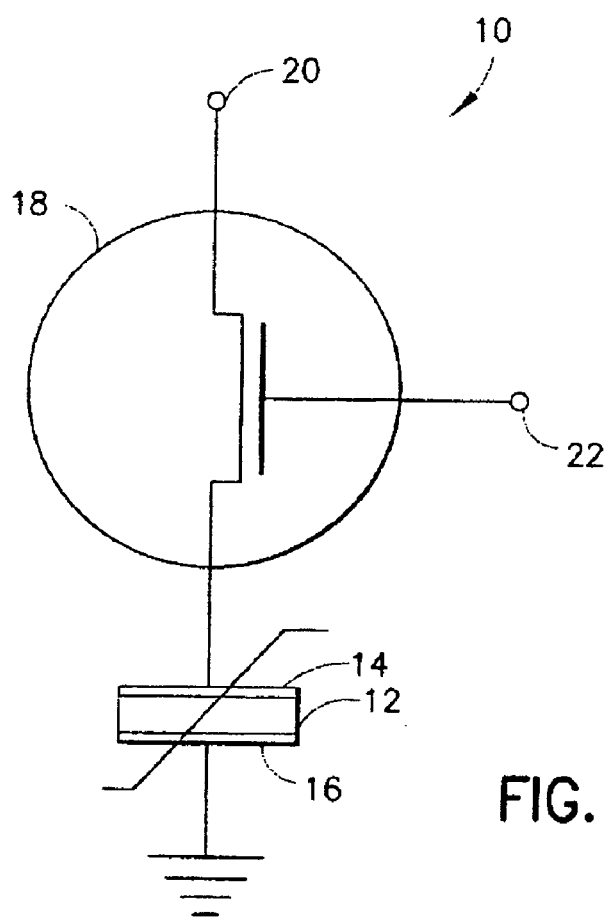
FIG. 1 is a schematic representation of a ferroelectric memory storage cell.

The present invention contemplates a number of distinct approaches to preventing oxygen deficiency in a ferroelectric or high $\epsilon$ film material on which a top electrode layer is deposited.

The disclosures of the following patents, patent applications and literature articles are hereby incorporated herein by reference in their entireties, in respect of techniques and approaches that may be usefully employed in the broad practice of the present invention for fabricating microelectronic device structures including ferroelectric or high $\epsilon$ film material having an electrode formed thereon: U.S. Pat. No. 5,783,716 issued Jul. 21, 1998 in the names of Thomas H. Baum, et al. for "PLATINUM SOURCE COMPOSITIONS FOR CHEMICAL VAPOR DEPOSITION OF PLATINUM;" U.S. Pat. No. 5,719,417 issued Feb. 17, 1998 in the names of Jeffrey Roeder, et al. for "FERROELECTRIC INTEGRATED CIRCUIT STRUCTURE;" U.S. patent application Ser. No. 08/975,087 filed Nov. 20, 1997 in the names of Frank S. Hintermaier, et al. for "LOW TEMPERATURE CHEMICAL VAPOR DEPOSITION PROCESS FOR FORMING BISMUTH-CONTAINING CERAMIC FILMS USEFUL IN FERROELECTRIC MEMORY DEVICES;" U.S. patent application Ser. No. 08/960,915 filed Oct. 30, 1997 in the names of Thomas H. Baum, et al. for "ANHYDROUS MONONUCLEAR TRIS(BETA-DIKETONATE) COMPOSITIONS FOR DEPOSITION OF BISMUTH-CONTAINING FILMS, AND METHOD OF MAKING THE SAME;" J. L. Vossen, W. Kern, Eds., *Thin Film Processes II*, Academic Press, Boston, Mass., 1991, pp. 763; and S. M Rossnagel, C. Nichols, S. Hamaguchi, D. Ruzic, R. Turkot, J. Vac. Sci. and Tech., 14(3) (1996) 1819–1827.

While the invention is primarily described hereinafter in reference to lead zirconium titanate ($PbZrTiO_3$), barium and/or strontium titanates (($Ba,Sr$)$TiO_3$), and strontium bismuth tantalates ($SrBi_2Ta_2O_9$), sometimes referred to as PZT, BST and SBT, respectively, it will be appreciated that the invention is applicable to other ferroelectric or high $\epsilon$ film materials, and other oxide perovskite and layered structure perovskites, as the substrate material on which the electrode is formed in accordance with the invention.

The ferroelectric or high $\epsilon$ film material is preferably formed by chemical vapor deposition, but it is recognized that other film formation and deposition techniques may be employed, as for example focused ion beam deposition, solution deposition, electroless deposition, electroplating deposition, sputtering, physical vapor deposition, etc. Chemical vapor deposition is preferred, however, and may be carried out using metalorganic precursors as source reagents for such deposition, optionally with liquid delivery wherein the precursor is in a liquid form, such as in the form of a liquid solution or suspension of the metalorganic compound(s) or complex(es) for the various metal constituents of the ferroelectric or high $\epsilon$ film material. The chemical vapor deposition may be of an assisted variety, e.g., plasma-assisted chemical vapor deposition.

The electrode likewise may be formed on the ferroelectric or high $\epsilon$ film material by any suitable deposition techniques, including those illustratively mentioned in the preceding paragraph. As an example, the electrode layer could be deposited by chemical vapor deposition, followed by patterning and etching, e.g., by reactive ion etching (RIE). Preferably the electrode is formed by sputtering, e.g., collimated sputtering to produce a patterned electrode element.

The oxidizing process of the present invention may be utilized to form the electrode/ferroelectric or high $\epsilon$ film material structure as a component of a microelectronic device article or device article precursor, without the need for post-formation annealing in oxidizing conditions, such as has been required in prior art practice when oxygen is abstracted or otherwise lost from the ferroelectric or high $\epsilon$ film material in the process of forming the electrode/ferroelectric or high $\epsilon$ film material structure.

The process conditions (temperatures, pressures, flow rates, fluxes, compositions, cycle and step times, etc.) that are utilized in the method of the present invention may be widely varied depending on the specific materials of fabrication of the electrode/ferroelectric or high $\epsilon$ film material structure, the desired morphological, chemical, stoichiometric, electrical, performance, etc. characteristics of the product structure. Advantageous process conditions usefully employed in the practice of the invention may therefore be readily determined without undue experimentation by those of ordinary skill in the art.

The method of the present invention may be carried out with a top electrode layer being deposited on a ferroelectric or high E film material, wherein the deposition is carried out with at least one of the deposition process characteristics (1)–(6) that are described in turn below.

(1) The top electrode may be formed of a metallic (non-oxide) material by sputtering in the presence of oxygen. Such technique may use as the oxygen source pure oxygen, ozone, or an oxygen-containing gas such as $N_2O$, $NO_2$, etc. Reactive sputtering with oxygen being present may be employed to deposit an oxide compound, but the sputtering conditions such as pressure, substrate temperature and deposition rate preferably are adjusted to deposit a sub-oxide or pure metal even when oxygen is present.

By such technique, the oxygen present in the deposition environment for formation of the electrode material will tend to prevent a net loss of oxygen in the surface of the ferroelectric or high $\epsilon$ film material. Once the ferroelectric or high $\epsilon$ film material surface is covered, a different TE formation process can continue, with the oxygen source being turned off, for example.

A pure metal TE may in some instances be desirable. In ferroelectric or high $\epsilon$ film material capacitor applications, an electrode of pure metal may be preferred because it has a higher work function, and the higher work function electrodes will reduce leakage in the ferroelectric or high $\epsilon$ film material capacitor, relative to the use of oxide or other material electrodes.

Sputtered pure metal top electrodes formed in the absence, or non-incorporative presence, of oxygen ("non-incorporative" meaning that such oxygen is not incorporated in the electrode film material despite being present in the film material formation environment) have lower compressive stress characteristics than those sputtered in the presence of oxygen where oxygen is incorporated in the electrode film. Such lower compressive stress electrodes may be desirable to facilitate the subsequent fabrication of additional layers or elements of the overall microelectronic device structure, and/or to enhance the end-use device characteristics of the structure being fabricated.

(2) The electrode may be formed of a noble metal that is formed by evaporation of a noble metal source material in the presence of oxygen. Such evaporative conditions result in a metal-based top electrode element, with a decreased tendency for the ferroelectric or high E film material to lose oxygen during TE deposition.

(3) The electrode layer may be formed by sputtering under conditions minimizing bombarding energy and flux during deposition, in order to minimize oxygen loss from the surface, and to reduce physical damage to the lattice of the underlying ferroelectric or high $\epsilon$ film material.

(4) The ferroelectric surface may be processed so that it contains excess oxygen, either in the lattice or in grain boundaries thereof, by ion implantation of oxygen at energies greater than 200 electron volts (eV), either prior or subsequent to TE deposition.

(5) The top electrode layer may be formed from a noble metal (typically Ir or Pt or alloys containing those species) by chemical vapor deposition (CVD), using a CVD process that incorporates oxygen, such as that described in U.S. Pat. No. 5,783,716 issued Jul. 21, 1998 in the names of Thomas H. Baum, et al. for "PLATINUM SOURCE COMPOSITIONS FOR CHEMICAL VAPOR DEPOSITION OF PLATINUM," the disclosure of which hereby is incorporated herein by reference in its entirety.

(6) A composite electrode film may be deposited, wherein the composite electrode film includes a noble metal and an oxide compound, particularly an oxide compound that readily relinquishes its oxygen content to the underlying ferroelectric or high $\epsilon$ film material subsequent to formation of the electrode film.

Examples of such oxygen-donor components of the composite electrode film include compounds such as MnO, $CeO_2$, etc. In the composite electrode film, the oxygen-donor compound(s) provide oxygen to the ferroelectric or high $\epsilon$ film material surface without a long diffusion path through the metallic electrode.

It will be appreciated that the process of the invention may include compatible multiple steps from the foregoing techniques (1)–(6).

In a specific embodiment of the invention utilizing lead zirconium titanate (PZT) as the ferroelectric or high $\epsilon$ film material, the formation of the top electrode may be carried out in a conventional manner, but without the oxygen-depletion effects that are characteristic of such conventional electrode formation techniques, by forming the underlying PZT film with a "superoxic" top surface region, in which the oxygen content of the top surface region, e.g., within a depth of 20–25 Angstroms measured from the top surface, is in excess of the stoichiometric requirement of the PZT material. In this manner, oxygen loss or abstraction during the electrode formation step is accommodated to yield an electrode coated PZT material that is substantially stoichiometrically complete in oxygen concentration.

In such embodiment of the invention, the top electrode layer is deposited on a surface of a PZT material, and the process is carried out with at least one of the following process characteristics (1) and (2):

(1) the PZT material is formed by a deposition growth process including growth of the PZT material in an oxygen-containing environment, and such growth is carried out during a terminal part of the process under oxygen-excess conditions; or (2) the PZT material is formed by a deposition growth process including growth of the PZT material in an oxygen-containing environment, wherein such growth is carried out during a terminal part of the process under oxygen-deficient conditions producing a correspondingly oxygen-deficient "metallic capping" layer.

In the first technique (1) described above, oxygen-excess conditions are employed so that oxygen is present in the growth environment in an amount that is above the stoichiometric amount required for combining with lead, zirconium and titanium to form $PbZrTiO_3$ in such environment. The oxygen-excess conditions are thereby used to "bulk up" the film in the vicinity of the ultimate deposition surface of the PZT, so that the subsequent deposition of the electrode film material does not deplete such vicinity of the underlying PZT material in oxygen content, below a stoichiometric level.

The amount of oxygen may therefore be maintained during the earlier portions of the growth process for the PZT material at a level (by appropriate partial pressure, absolute pressure and concentration) that is in the proper stoichiometric amount for $PbZrTiO_3$ formation, with the amount of oxygen then being increased to the "excess-oxygen conditions" in the latter stage of the growth process. As a result, the film in the vicinity of and at the top surface of the PZT material will have an "excess" inventory of oxygen available for the subsequent electrode formation step.

Accordingly, when the electrode formation step strips oxygen from the underlying film, an excess inventory of oxygen in the ferroelectric or high $\epsilon$ film material will satisfy the TE formation step. The level of such depletion can be maintained by the choice of process conditions in the TE formation step, so that the non-extracted oxygen remains in the ferroelectric or high $\epsilon$ film material, in proper stoichiometric proportion to the metal cations therein, e.g., in the case of PZT, the lead, zirconium and titanium constituents.

In the alternative PZT process of technique (2), the PZT material is formed by a deposition growth process including growth of the PZT material in an oxygen-containing environment, wherein such growth is carried out during a terminal part of the process under oxygen-deficient conditions producing a correspondingly oxygen-deficient "metallic capping" layer. Such metallic capping layer serves to reduce oxygen mobility/depletion in the ferroelectric or high $\epsilon$ film material during the subsequent top electrode formation. The metallic capping layer can be etched in a pre-TE formation step under conditions that minimize surface depletion of oxygen, thereby exposing the desired PZT film material surface for the electrode formation step.

Referring now to the drawings, FIG. 1 is a schematic representation of an illustrative device in which the capacitor components may be fabricated in accordance with the method of the present invention. The ferroelectric memory storage cell 10 is shown schematically as comprising a thin ferroelectric material layer 12 between plates 14 and 16 of a capacitor. Such capacitor is connected to the transistor 18 to form the storage cell, with the transistor being joined to a bit-line element 20 and to a word-line element 22, as shown.

In accordance with the invention, the ferroelectric material layer 12 may be formed of PZT, BST or SBT, deposited on the bottom electrode plate 16 by a suitable process such as CVD. The top electrode may be formed of Pt or Ir or their respective oxides, by sputtering in a manner consistent with the invention, to avoid depletion of the oxygen content of the surface region of the ferroelectric material layer 12.

Figure 2:
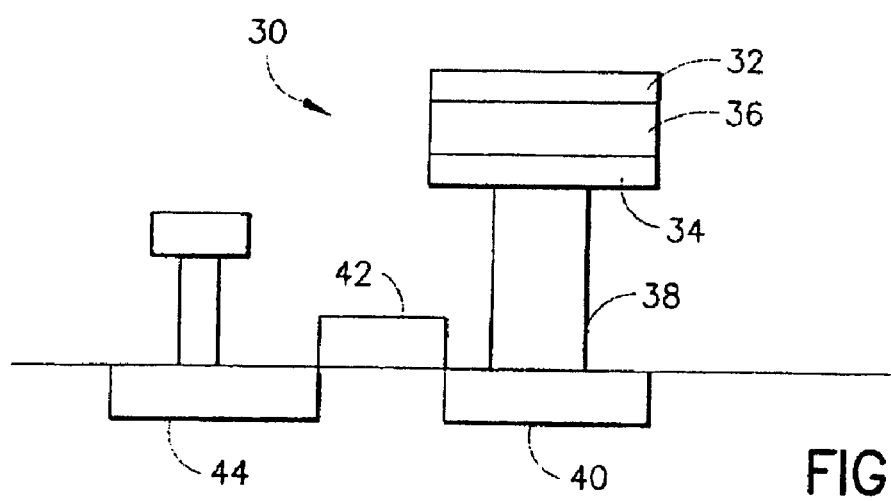
FIG. 2 is a schematic representation of a stacked capacitor, which is plug-connected to the drain of a MOSFET structure, wherein the device utilizes an SBT ferroelectric capacitor layer.

FIG. 2 is a schematic representation of a stacked capacitor and transistor assembly illustrating how the ferroelectric or high $\epsilon$ film material can be integrated in a storage cell. The capacitor 30 comprises a top electrode 32, and bottom electrode 34 on which is disposed a thin film ferroelectric material layer 36, as shown. The bottom electrode 34 is connected by plug 38 to the drain 40 of the transistor. The plug may be made of any suitable material, as for example from polysilicon or tungsten. The transistor comprises gate 42 and a source 44.

Figure 3:
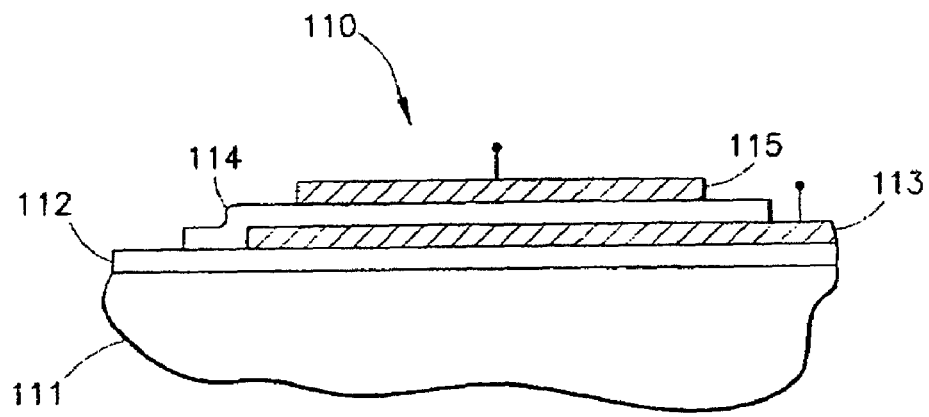
FIG. 3 is a schematic representation of an illustrative microelectronic device structure according to another embodiment of the present invention.

FIG. 3 shows a schematic representation of another microelectronic device structure that may be fabricated in accordance with the present invention, utilizing a ferroelectric or high $\epsilon$ film material and a top electrode formed by deposition on the ferroelectric or high $\epsilon$ film material, wherein numerals 110–115 refer, respectively, to an integrated (thin film) capacitor, Si substrate, diffusion barrier layer, bottom electrode, titanate (e.g., PZT or BST) dielectric, and top electrode.

Figure 4:
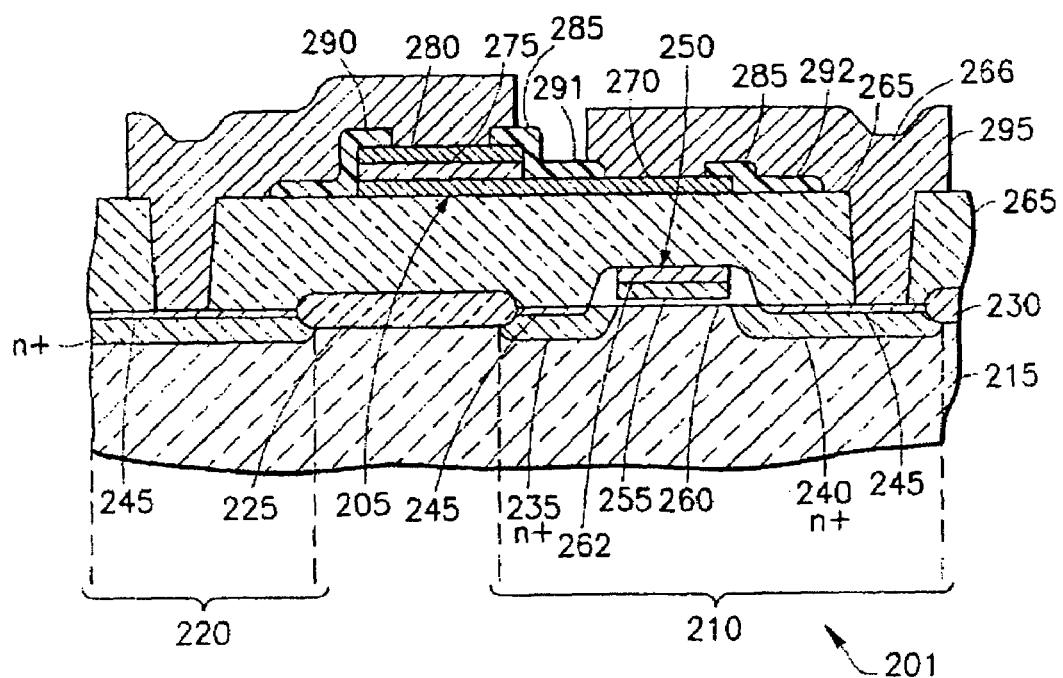
FIG. 4 schematically depicts a portion of an integrated circuit (IC) including an integrated capacitor according to an illustrative embodiment of the invention.

FIG. 4 schematically shows a portion of an exemplary IC with an integral capacitor that may be fabricated in accordance with the invention. The illustrated portion of integrated circuit 201 includes a first active device 210, such as a conventional metal-oxide-semiconductor field effect transistor (MOSFET), and a capacitor 205 employing a dielectric film layer of (Ba,Sr) titanate formed on a substrate 215, such as a silicon substrate. A drain region of a second transistor 220 is also shown. The particular types of active devices employed, e.g., NMOS, PMOS or CMOS, are based on the desired operation of the integrated circuit and are not critical for practicing the present invention. Other suitable active devices include, for example, bipolar junction transistors and GaAs MESFETs. The transistors 210 and 220 can be fabricated, for example, by conventional processing methods. In FIG. 4, the transistors 210 and 220 include field oxide regions, 225 and 230 which are formed, for example, by $SiO_2$ and operate as insulators between the transistor 210 and adjacent devices, such as the transistor 220. Source and drain regions 235 and 240 of the transistor 210 are formed by doping with n-type impurities, such as arsenic or phosphorus for NMOS. An optional layer of silicide 245 is deposited over the source and drain regions 235 and 240 to reduce the source and drain resistance, which enables greater current delivery by the transistor 210.

A gate 250 of the transistor 210 includes, for example, polysilicon 255 doped with an n-type impurity, such as by an implant or vapor doping. The gate polysilicon 255 is disposed on a $SiO_2$ spacer 260. An optional layer of silicide 262 is also deposited over the gate polysilicon 255 to reduce the electrical resistance of the gate 250. An insulating layer 265 of, for example, P-glass which is an oxide doped with phosphorus is then deposited on the transistors 210 and 220 to provide protection to the transistors 210 and 220 and to facilitate electrical connection. Contact windows 266 are then etched in the insulating layer 265 to expose the device gate 250 and source and drain regions, such as the regions 235 and 240. Although only the drain regions of the transistors 210 and 220 are exposed in the cross-section of the integrated circuit illustrated in FIG. 4, it should be readily understood that the gate and source are exposed at other areas of the integrated circuit 1 that are outside the illustrated cross-section.

The capacitor 205 includes a first electrode 270 formed on the insulating layer surface, a dielectric thin film region 275 on the first electrode 270, and a second electrode 280 formed on the dielectric film region 275 opposite the first electrode 270. It is possible for the first electrode 270 to have a two-layer structure. Such a structure is, for example, a layer of platinum formed over a layer of Ti-nitride. Platinum alone is not a suitable electrode material, however, since it adversely chemically reacts with silicon. As a consequence, a diffusion barrier is advantageously employed as the second electrode layer which is in contact with the insulating layer surface, to substantially prevent a chemical reaction between the platinum and the silicon of the substrate 215. Suitable thicknesses for each layer of the two-layer structure are in the range of 0.01 to 0.5 $\mu$m.

It is further possible for the first electrode 270 to be a single layer structure of an appropriate conductive material. Overall suitable thicknesses for the first electrode 270, whether a one or two layer structure, are in the range of approximately 0.1 to 0.5 $\mu$m. Thicknesses less than 0.1 $\mu$m are undesirable because of its high electrical resistance while thicknesses greater than 0.5 $\mu$m are generally disadvantageous because of high fabrication cost and poor adherence. The first electrode 270 is larger than the second electrode 280 to provide electrical connection to the first electrode 270.

After formation of the capacitor 205, an insulating material 285, such as, for example, $SiO_2$ is deposited on edge regions 290, 291 and 292 of the capacitor 205 to prevent short circuits between the first and second capacitor electrodes 270 and 280 when the interconnection layer is formed. An interconnection layer 295 is then formed on the insulation layer and corresponding etched contact windows to electrically connect the devices 210 and 220 and the capacitor 205 in a desired manner. Suitable materials for the interconnection layer 295 include aluminum and copper. In the integrated circuit 201, the drain 240 of the transistor 210 is electrically connected to the first electrode 270 of the capacitor 205 and the capacitor's second electrode 280 is electrically connected to the source of the transistor 220.

The methodology of the invention enables the production of a microelectronic device structure including a top electrode layer on a ferroelectric or high ∈ film material, wherein the ferroelectric or high ∈ film material comprises an oxide perovskite, and the top electrode layer comprises a metal deposited on a surface of the ferroelectric or high ∈ film material, wherein the ferroelectric or high e film material at said surface and in the vicinity thereof is substantially stoichiometrically complete in oxygen concentration.

The prior art has not been able to achieve such stoichiometric regularity in oxygen concentration in the vicinity of the top surface of the ferroelectric or high ∈ film material, due to the abstraction or scavenging of oxygen from the underlying film material when the top electrode is deposited on the film material. Such depletion effects are avoided in the practice of the present invention, which enables the production of microelectronic device structures, such as capacitive memory cells, decoupling capacitors and infrared detectors, having high-performance electrode/ferroelectric or high ∈ film material architectures. As such, the present invention achieves a significant advance in the art.

While the invention has been described herein with reference to specific features, aspects and embodiments, it will be appreciated that the utility of the invention is not thus limited, and that the invention contemplates variations, modifications and other embodiments of the disclosed forms of the invention. Accordingly, the invention is to be broadly interpreted and construed, to encompass all such alternative variations, modifications and other embodiments, within the spirit and scope of the claims hereinafter set forth.

What is claimed is:

1. A microelectronic device structure comprising:
    a silicon substrate comprising at least one additional layer selected from the group consisting of a bottom electrode layer, a diffusion barrier layer, an insulating layer and a buffer layer;
    a ferroelectric oxide film material positioned over the silicon substrate, wherein the ferroelectric oxide material has a top surface and vicinity thereunder that is substantially stoichiometrically complete in oxygen concentration;
    a top electrode comprising a top surface and a bottom surface, wherein the bottom surface directly contacts the top surface of the ferroelectric oxide film material and comprises a metal sub-oxide material selected from the group consisting of Ir sub-oxides, Rh sub-oxides, and mixtures thereof, and the top surface of the top electrode consists of a metal selected from the group consisting of Ir, Rh and mixtures thereof, wherein the transition from the bottom surface of the top electrode to the top surface of the top electrode is increasingly metallic.

2. The microelectronic device structure according to claim 1, wherein said ferroelectric film comprises an oxide perovskite or layered structure perovskite.

3. The microelectronic device structure according to claim 1, wherein said ferroelectric film comprises a material selected from the group consisting of lead zirconium titanate, barium and/or strontium titanates, and strontium bismuth tantalates.

4. The microelectronic device structure according to claim 1, wherein said ferroelectric film comprises a lead zirconium titanate material.

5. The microelectronic device structure according to claim 1, wherein said ferroelectric film comprises a barium and/or strontium titanate material.

6. The microelectronic device structure according to claim 1, wherein said ferroelectric film comprises a strontium bismuth tantalate material.

7. The microelectronic device structure according to claim 1, wherein said top electrode comprises an Ir sub-oxides material.

8. The microelectronic device structure according to claim 1, wherein said top electrode comprises Ir.

9. The microelectronic device structure according to claim 1, wherein the top electrode comprises an Ir sub-oxide material and Ir.

10. The microelectronic device structure according to claim 1, wherein said top electrode comprises Rh.

11. A ferroelectric or high ∈ capacitor comprising:
    a silicon substrate comprising at least one additional layer selected from the group consisting of a bottom electrode layer, a diffusion barrier layer, an insulating layer and a buffer layer;
    a thin film of an ferroelectric oxide material positioned over the bottom electrode, wherein the thin film of ferroelectric oxide material has a top surface that is substantially stoichiometrically complete in oxygen concentration, wherein said ferroelectric oxide material comprises a material selected from the group consisting of lead zirconium titanate, barium and/or strontium titanates, and strontium bismuth tantalates; and
    a top electrode comprising a top surface and a bottom surface, wherein the bottom surface directly contacts the top surface of the thin film of ferroelectric oxide material and consists essentially of a metal sub-oxide material selected from the group consisting of Ir oxides, Rh sub-oxides, and mixtures thereof, and the top layer consists essentially of a metal selected from the group consisting of Ir, Rh and mixtures thereof, wherein the transition from the bottom surface of the top electrode to the top surface of the top electrode is increasingly metallic, and wherein the oxygen concentration of the ferroelectric oxide film is maintained during the formation of the bottom surface of the top electrode without the need for post-deposition annealing in oxygen.

12. The microelectronic device structure according to claim 1, wherein said top electrode comprises an Rh sub-oxide material.

* * * * *